(12) United States Patent
Chen et al.

(10) Patent No.: US 12,132,030 B2
(45) Date of Patent: Oct. 29, 2024

(54) LIGHT EMITTING DIODE (LED) DISPLAY PANEL

(71) Applicant: Shenzhen China Star Optoelectronics Semiconductor Display Technology Co., Ltd., Guangdong (CN)

(72) Inventors: Lixuan Chen, Guangdong (CN); Xin Zhang, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 992 days.

(21) Appl. No.: 17/051,258

(22) PCT Filed: Aug. 4, 2020

(86) PCT No.: PCT/CN2020/106815
§ 371 (c)(1),
(2) Date: Oct. 28, 2020

(87) PCT Pub. No.: WO2022/007075
PCT Pub. Date: Jan. 13, 2022

(65) Prior Publication Data
US 2023/0140130 A1    May 4, 2023

(30) Foreign Application Priority Data
Jul. 6, 2020   (CN) .......................... 202010641657.1

(51) Int. Cl.
*H01L 25/075*   (2006.01)

(52) U.S. Cl.
CPC ............................... *H01L 25/0753* (2013.01)

(58) Field of Classification Search
CPC ........ H01L 25/0753; H01L 33/62; G09F 9/33
See application file for complete search history.

(56) References Cited

U.S. PATENT DOCUMENTS

| | | | |
|---|---|---|---|
| 2014/0218956 A1 | 8/2014 | Wu | |
| 2016/0093244 A1* | 3/2016 | Kazmierski | G06F 3/1446 345/1.3 |
| 2017/0140679 A1 | 5/2017 | Tomoda et al. | |
| 2018/0122288 A1 | 5/2018 | Huang et al. | |
| 2021/0405279 A1* | 12/2021 | Wei | G02B 6/0055 |

FOREIGN PATENT DOCUMENTS

| | | |
|---|---|---|
| CN | 101839423 | 9/2010 |
| CN | 103969864 | 8/2014 |
| CN | 106023821 | 10/2016 |
| CN | 106133812 | 11/2016 |

(Continued)

*Primary Examiner* — Ratisha Mehta (57) ABSTRACT

An LED display panel is provided by the present application. Two adjacent LED devices located on both ends of a first splicing seam have a first splicing distance therebetween, and the first splicing distance is defined as D1+ΔA1. A first region is disposed with a plurality of first LED devices thereon. A pitch between at least portions of two adjacent first LED devices gradually decreases from an end close to the first splicing seam to an end away from the first splicing seam in the first region in a first direction, and a pitch between any two adjacent first LED devices is less than the first splicing distance and greater than a first target pitch.

17 Claims, 2 Drawing Sheets

(56) References Cited

FOREIGN PATENT DOCUMENTS

| | | |
|---|---|---|
| CN | 106353918 | 1/2017 |
| CN | 106537235 | 3/2017 |
| CN | 108230923 | 6/2018 |
| CN | 109326226 | 2/2019 |
| CN | 109656058 | 4/2019 |
| CN | 210137495 | 3/2020 |
| CN | 111290174 | 6/2020 |
| JP | 2005-031247 | 2/2005 |

* cited by examiner

LIGHT EMITTING DIODE (LED) DISPLAY PANEL

RELATED APPLICATIONS

This application is a National Phase of PCT Patent Application No. PCT/CN2020/106815 having International filing date of Aug. 4, 2020, which claims the benefit of priority of Chinese Patent Application No. 202010641657.1 filed on Jul. 6, 2020. The contents of the above applications are all incorporated by reference as if fully set forth herein in their entirety.

FIELD AND BACKGROUND OF THE INVENTION

The present application relates to a field of display technology, and more particularly to a light emitting diode (LED) display panel.

When splicing light emitting diode (LED) sub-substrates of existing spliced LED display panels, due to a mechanical accuracy and tolerance and limitations of the LED sub-substrates themselves, splicing seams easily appear, and the splicing seams are relatively large.

Spacing between LED lights in the LED sub-substrates is the same, and the splicing seams will easily cause the spacing between the LED lights on both sides to become larger, making the spacing between the LEDs on both sides of the splicing seams be obviously inconsistent with the spacing between the others LED lights in the panel, which affects display effects.

SUMMARY OF THE INVENTION

Embodiments of the present application provides a light emitting diode (LED) display panel to solve problems in the existing LED display panel that produces a splicing seam due to splicing of LED sub-substrates, which causes a distance between the LED lights on both sides of the seam to be inconsistent with that of a distance between the adjacent LED lights in other sub-substrates, which in turn affects display effects.

An embodiment of the present application provides a light emitting diode (LED) display panel, comprising a substrate and a plurality of LED devices disposed on the substrate, the plurality of LED devices are arranged in an array, and the substrate is formed by splicing at least two sub-substrates, wherein:

the two adjacent sub-substrates are spliced to form a first splicing seam in the first direction, the first direction intersects an extension direction of the first splicing seam, the two adjacent LED devices located on both ends of the first splicing seam have a first splicing distance therebetween, the first splicing distance is defined as $D1+\Delta A1$, wherein $D1$ is a first target pitch, and $\Delta A1$ is a first splicing tolerance;

the plurality of LED devices comprise a plurality of first LED devices, a first region is disposed on the sub-substrates located on both sides of the first splicing seam, the first region is located on the sub-substrate close a side of the first splicing seam, and the first region is disposed with the plurality of first LED devices thereon;

a pitch between at least portions of two adjacent first LED devices gradually decreases from an end close to the first splicing seam to an end away from the first splicing seam in the first region in the first direction, and the pitch between any two adjacent first LED devices is less than the first splicing distance and greater than the first target pitch; and a pitch between two adjacent first LED devices gradually decreases from an end close to the first splicing seam to an end away from the first splicing seam in the first region in the first direction, and the $D1$ is less than or equal to three microns In the LED display panel of the present application, differences between every two adjacent pitches are equal, gradually increase, or gradually decrease in the first region in the first direction from an end close to the first splicing seam to an end away from the first splicing seam.

In the LED display panel of the present application, a second region is further disposed on the sub-substrates, and the second region is located on one side of the sub-substrate away from the first splicing seam, the plurality of LED devices further comprise a plurality of second LED devices, and the plurality of the second LED devices are disposed on the second region; and a pitch between two adjacent second LED devices are equal from an end close to the first splicing seam to an end away from the first splicing seam in the second region in the first direction, and the pitch between any two adjacent second LED devices equals to the first target pitch.

In the LED display panel of the present application, a second region is further disposed on the sub-substrates, and the second region is located on a side of the sub-substrate away from the first splicing seam, the plurality of LED devices further comprise a plurality of second LED devices, and the plurality of second LED devices are disposed on the second region; and a pitch between two adjacent second LED devices gradually decreases from an end close to the first splicing seam to an end away from the first splicing seam in the second region in the first direction, and the pitch between any two adjacent second LED devices is less than or equal to the first target pitch.

In the LED display panel of the present application, the number of the sub-substrates is at least three, two adjacent sub-substrates are spliced to form a second splicing seam in a second direction, and the second direction intersects with an extension direction of the second splicing seam and is perpendicular to the first direction; and the two adjacent LED devices located on both ends of the second seam have a second splicing distance therebetween, and the second splicing distance is defined as $D2+\Delta A2$, wherein $D2$ is a second target pitch, and $\Delta A2$ is a second splicing tolerance;

a third region is disposed on the sub-substrates located on both sides of the second splicing seam, the third region is located on the sub-substrate close to one side of the second splicing seam, the plurality of LED devices comprise a plurality of third LED devices, and the third LED devices are disposed on the third region; and a pitch between at least portions of two adjacent third LED devices gradually decreases from an end close to the second splicing seam to an end away from the second splicing seam in the third region in the second direction, and is greater than the second target pitch.

In the LED display panel of the present application, a pitch between two adjacent third LED devices gradually decreases in the third region in the second direction from an end close to the second splicing seam to an end away from the second splicing seam.

In the LED display panel of the present application, the $D2$ is less than or equal to three microns.

In the LED display panel of the present application, differences between every two adjacent pitches are equal, gradually increase, or gradually decrease in the third region in the second direction from an end close to the second splicing seam to an end away from the second splicing seam.

An embodiment of the present application further provides a LED display panel, comprising a substrate and a plurality of LED devices disposed on the substrate, the plurality of LED devices are arranged in an array, and the substrate is formed by splicing at least two sub-substrates, wherein:

the two adjacent sub-substrates are spliced to form a first splicing seam in the first direction, the first direction intersects an extension direction of the first splicing seam, the two adjacent LED devices located on both ends of the first splicing seam have a first splicing distance therebetween, the first splicing distance is defined as D1+ΔA1, wherein D1 is a first target pitch, and ΔA1 is a first splicing tolerance;

the plurality of LED devices comprise a plurality of first LED devices, a first region is disposed on the sub-substrates located on both sides of the first splicing seam, the first region is located on the sub-substrate close a side of the first splicing seam, and the first region is disposed with the plurality of first LED devices thereon; and a pitch between at least portions of two adjacent first LED devices gradually decreases from an end close to the first splicing seam to an end away from the first splicing seam in the first region in the first direction, and the pitch between any two adjacent first LED devices is less than the first splicing distance and greater than the first target pitch.

In the LED display panel of the present application, a pitch between two adjacent first LED devices gradually decreases from an end close to the first splicing seam to an end away from the first splicing seam in the first region in the first direction.

In the LED display panel of the present application, the D1 is less than or equal to three microns.

In the LED display panel of the present application, differences between every two adjacent pitches are equal, gradually increase, or gradually decrease in the first region in the first direction from an end close to the first splicing seam to an end away from the first splicing seam.

In the LED display panel of the present application, a second region is further disposed on the sub-substrates, and the second region is located on one side of the sub-substrate away from the first splicing seam, the plurality of LED devices further comprise a plurality of second LED devices, and the plurality of the second LED devices are disposed on the second region; and a pitch between two adjacent second LED devices are equal from an end close to the first splicing seam to an end away from the first splicing seam in the second region in the first direction, and the pitch between any two adjacent second LED devices equals to the first target pitch.

In the LED display panel of the present application, a second region is further disposed on the sub-substrates, and the second region is located on a side of the sub-substrate away from the first splicing seam, the plurality of LED devices further comprise a plurality of second LED devices, and the plurality of the second LED devices are disposed on the second region; and a pitch between two adjacent second LED devices gradually decreases from an end close to the first splicing seam to an end away from the first splicing seam in the second zone in the first direction, and the pitch between any two adjacent second LED devices is less than or equal to the first target pitch.

In the LED display panel of the present application, the number of the first LED device in the third region in the second direction is between 2 to 150.

In the LED display panel of the present application, the number of the sub-substrates is at least three, two adjacent sub-substrates are spliced to form a second splicing seam in a second direction, and the second direction intersects with an extension direction of the second splicing seam and is perpendicular to the first direction; and the two adjacent LED devices located on both ends of the second seam have a second splicing distance therebetween, and the second splicing distance is defined as D2+ΔA2, wherein D2 is a second target pitch, and ΔA2 is a second splicing tolerance;

a third region is disposed on the sub-substrates located on both sides of the second splicing seam, the third region is located on the sub-substrate close to one side of the second splicing seam, the plurality of LED devices comprise a plurality of third LED devices, and the third LED devices are disposed on the third region; and a pitch between at least portions of two adjacent third LED devices gradually decreases from an end close to the second splicing seam to an end away from the second splicing seam in the third region in the second direction, and is greater than the second target pitch.

In the LED display panel of the present application, a pitch between two adjacent third LED devices gradually decreases in the third region in the second direction from an end close to the second splicing seam to an end away from the second splicing seam.

In the LED display panel of the present application, the D2 is less than or equal to three microns.

In the LED display panel of the present application, differences between every two adjacent pitches are equal, gradually increase, or gradually decrease in the third region in the second direction from an end close to the second splicing seam to an end away from the second splicing seam.

In the LED display panel of the present application, a fourth region is further disposed on the sub-substrates, and the fourth region is located on a side of the sub-substrate away from the second splicing seam, the plurality of LED devices further comprise a plurality of fourth LED devices, and the plurality of fourth LED devices are disposed on the fourth region; and a pitch between two adjacent fourth LED devices are equal in the second region in the second direction, and the pitch between any two adjacent fourth LED devices equals to the second target pitch.

In the LED display panel of the present application, the number of the third LED device in the third region in the second direction is between 2 to 150.

In the LED display panel of the present application, the first direction is perpendicular to the extension direction of the first splicing seam, and the second direction is perpendicular to the extension direction of the second splicing seam.

In a light emitting diode (LED) display panel of the present application, an LED device pitch transition region (i.e. a first region) is disposed on both sides of a splicing seam. A pitch between LED devices gradually decreases from an end close to the splicing seam to an end away from the first splicing seam in the first region to improve visual effects of overly large splicing seams, thereby improving display effects of the LED display panel.

BRIEF DESCRIPTION OF THE SEVERAL VIEWS OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

In the description of the present application, it should be understood that the terms "portrait", "lateral", "length", "width", "upper", "lower", "front", "rear", "left", "right", "vertical", "horizontal", "top", "bottom", "inner", "outer", "clockwise", "counterclockwise" etc. indicated orientation or positional relationship is based on the orientation or positional relationship shown in the drawings, only to facilitate the description of this application and simplify the description, not to indicate or imply the device referred to Or the element must have a specific orientation, be constructed and operated in a specific orientation, and therefore cannot be understood as a limitation of the present application. In addition, the terms "first" and "second" are used for descriptive purposes only, and cannot be understood as indicating or implying relative importance or implicitly indicating the number of technical features indicated. Thus, the features defined as "first" and "second" may explicitly or implicitly include one or more of the features. In the description of this application, the meaning of "a plurality of" is two or more, unless otherwise specifically limited.

In the description of this application, it should be noted that, unless otherwise clearly specified and limited, the terms "installation", "connection", and "connection" should be understood in a broad sense, for example, it can be fixed connection or detachable Connected, or integrally connected; it can be mechanical, electrical, or can communicate with each other; it can be directly connected, or it can be indirectly connected through an intermediary, it can be the connection between two elements or the interaction of two elements relationship. Those of ordinary skill in the art can understand the specific meanings of the above terms in this application according to specific situations.

In this application, unless otherwise clearly specified and defined, the first feature "above" or "below" the second feature may include the direct contact of the first and second features, or may include the first and second features Not direct contact but contact through another feature between them. Moreover, the first feature is "above", "above" and "above" the second feature includes that the first feature is directly above and obliquely above the second feature, or simply means that the first feature is higher in level than the second feature. The first feature is "below", "below", and "below" the second feature includes that the first feature is directly below and obliquely below the second feature, or simply means that the first feature is less horizontal than the second feature.

The following disclosure provides many different embodiments or examples for implementing different structures of the present application. In order to simplify the disclosure of the present application, the components and settings of specific examples are described below. Of course, they are only examples, and the purpose is not to limit this application. In addition, the present application may repeat reference numerals and/or reference letters in different examples. Such repetition is for the purpose of simplicity and clarity, and does not itself indicate the relationship between the various embodiments and/or settings discussed. In addition, the present application provides examples of various specific processes and materials, but those of ordinary skill in the art may be aware of the application of other processes and/or the use of other materials.

Figure 1:
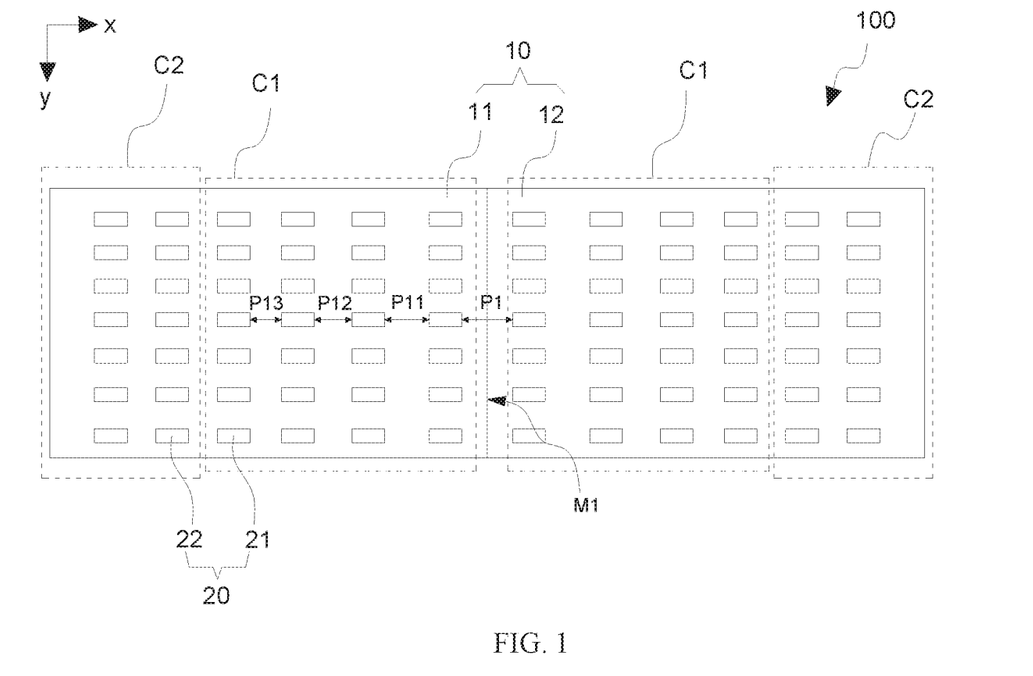
FIG. 1 is a schematic structural diagram of a first embodiment of a light emitting diode (LED) display panel of the present application.

FIG. 1 is a schematic structural diagram of a first embodiment of a light emitting diode (LED) display panel of the present application.

The first embodiment of the present application provides an LED display panel 100, comprising a substrate 10 and a plurality of LED devices 20 disposed on the substrate 10. The plurality of LED devices 20 are arranged in an array, and the substrate 10 is formed by splicing at least two sub-substrates.

Two adjacent sub-substrates are spliced to form a first splicing seam M1 in a first direction x, and the first direction x intersects an extension direction of the first splicing seam M1. The two adjacent LED devices 20 located on both ends of the first splicing seam M1 have a first splicing distance P1 therebetween, the first splicing distance P1 is defined as D1+ΔA1, wherein D1 is a first target pitch, and ΔA1 is a first splicing tolerance.

The plurality of LED devices 20 comprise a plurality of first LED devices 21. A first region C1 is disposed on the sub-substrates located on both sides of the first splicing seam M1. The first region C1 is located on the sub-substrate close a side of the first splicing seam M1, and the first region C1 is disposed with the plurality of first LED devices 21 thereon.

A pitch between at least portions of two adjacent first LED devices 21 gradually decreases from an end close to the first splicing seam M1 to an end away from the first splicing seam M1 in the first region C1 in the first direction x, and the pitch between any two adjacent first LED devices 21 is less than the first splicing distance P1 and greater than the first target pitch D1.

In the LED display panel 100 of the first embodiment, an LED device pitch transition region (i.e. the first region C1) is disposed on both sides of the first splicing seam M1. A pitch between the first LED devices 21 gradually decreases from an end close to the first splicing seam M1 to an end away from the first splicing seam M1 in the first region C1 to improve visual effects of overly large first splicing seam M1, thereby improving display effects of the LED display panel 100.

Specifically, please refer to FIG. 1. In the first embodiment, two sub-substrates are spliced into one LED display panel 10 as an example for description, but it is not limited to thereof.

The two sub-substrates are the first sub-substrate 11 and the second sub-substrate 12, respectively. The first sub-substrate 11 and the second sub-substrate 12 are spliced and arranged along the first direction x. In some embodiments, the first sub-substrate 11 and the second sub-substrate 12 may also be spliced and arranged along a second direction y.

The LED devices 20 disposed along the first direction x are the LED devices 20 in the row direction, and the LED devices 20 disposed along the second direction y are the LED devices 20 in the column direction. The first direction x is perpendicular to the extending direction of the first splicing seam M1.

A pitch between two adjacent first LED devices 21 gradually decreases from an end close to the first splicing seam M1 to an end away from the first splicing seam M1 in the first region C1 in the first direction x.

In the first region C1 in the first direction x, the number of the first LED devices 21 is between 2 and 150. In other words, the transition from P1 to D1 requires 2 to 150 first LED devices 21. Optionally, the number of the first LED devices 21 is between 4 and 100.

Specifically, the transition of four columns of first LED devices 21 from a side close to the first splicing seam M1 to a side away from the first splicing seam M1 in the first embodiment is taken as an example, and there are the first, second, third, and fourth columns of the first LED device 21 in turn. A pitch between the first LED devices 21 in the first and second columns is P11, a pitch between the first LED devices 21 in the second and third columns is P12, and a pitch between the first LED devices 21 in the third and fourth columns is P13.

Among them, P1>D1, P1>P11>P12>P13>D1. That is to say, from P1 to P13 can be gradually decreased, or an interval can be decreased. When P1 to P13 is gradually decreased, P1>P11>P12>P13, and when an interval from P1 to P13 is decreased, P1=P11>P12>P13, P1>P11=P12>P13, P1>P11>P12=P13, or P1>P11=P12-P13, or may be other decreasing conditions.

In the first embodiment, in the first region C1 in the first direction x, the pitch between two adjacent first LED devices 21 decreases from an end close to the first splicing seam M1 to an end away from the first splicing film M1. That is the case of P1>P11>P12>P13.

Of course, in some embodiments, the pitch between the first LED devices 21 in the first direction x may also be first decreased, then increased and then decreased, as long as it gradually decreases to close to D1.

In addition, the first splicing distance is defined as D1+ΔA1, wherein D1 is a first target pitch, and ΔA1 is a first splicing tolerance. The first target distance D1 is set according to the resolution of the LED display panel 100. That is, the higher the resolution of the LED display panel 100, the smaller the first target distance D1 between the LED devices 20.

Optionally, D1 is less than or equal to 3 microns. Preferably, D1 is greater than or equal to 0.5 microns but less than or equal to 2 microns. However, the first target distance D1 is not limited to this, and D1 may also be greater than 3 microns, such as 4 microns, 5 microns, and so on.

The first splicing tolerance ΔA1 comprises splicing mechanism tolerances, sub-substrate size tolerances, and other size tolerances. The first splicing tolerance ΔA1 causes the first splicing seam M1 to be too large, that is, P1 is greater than D1, thereby affecting the display effects.

In the LED display panel 100 of the first embodiment, the difference between two adjacent pitches from one end close to the first splicing seam M1 to one end away from the seam M1 is equal in the first region C1 in the first direction x. That is, P1−P11=P11−P12=P12−P13.

In some embodiments, the difference between the pitches can also be increased or decreased from an end close to the first splicing seam M1 to an end away from the first splicing seam M1 in the first region C1 in the first direction x. When the difference value increases, it is convenient to quickly fade to D1, which shortens the transition number of the first LED device 21. When the difference value decreases, the gradation tends to be gentle and the visual effects are improved.

In the LED display panel 100 of the first embodiment, a second region C2 is further disposed on the sub-substrates. The second region C2 is located on one side of the sub-substrate away from the first splicing seam M1. The plurality of LED devices 20 further comprise a plurality of second LED devices 22, and the plurality of the second LED devices 22 are disposed on the second region C2.

A pitch between two adjacent second LED devices 22 are equal from an end close to the first splicing seam M1 to an end away from the first splicing seam M1 in the second region C2 in the first direction x, and the pitch between any two adjacent second LED devices 22 equals to the first target pitch D1.

Figure 2:
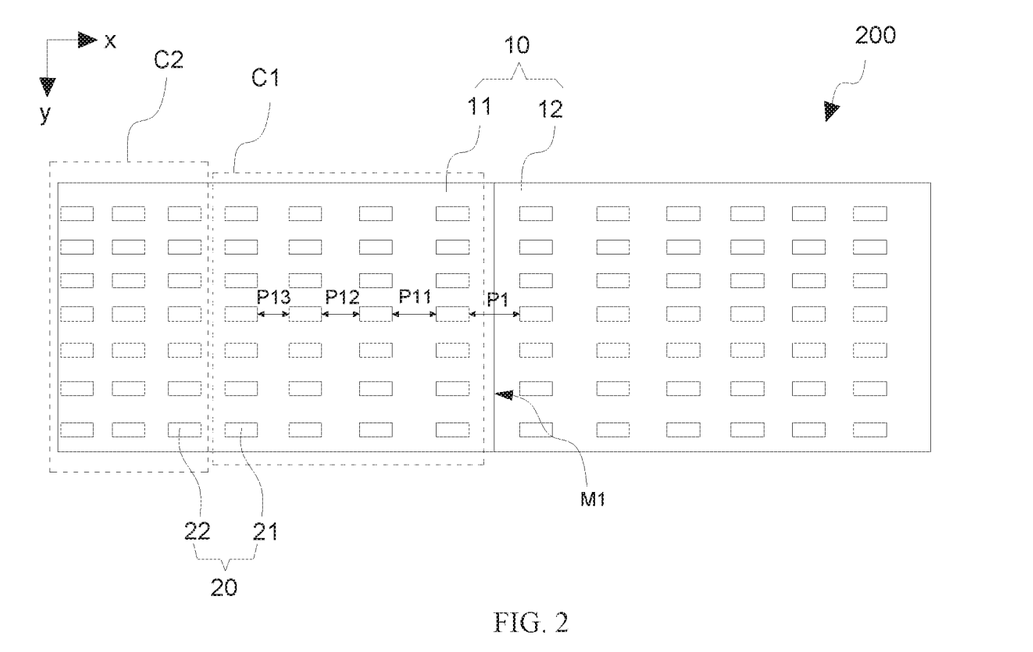
FIG. 2 is a schematic structural diagram of a second embodiment of the LED display panel of the present application.

Please refer to FIG. 2, differences between the LED display panel 200 of the second embodiment and the LED display panel 100 of the first embodiment are:

A pitch between two adjacent second LED devices 22 gradually decreases from an end close to the first splicing seam M1 to an end away from the first splicing seam M1 in the second region C2 in the first direction x, and the pitch between any two adjacent second LED devices 22 is less than or equal to the first target pitch D1.

The LED display panel 200 of the second embodiment is on the basis of the first embodiment, and the spacing relationship between the second LED devices 22 in the second region C2 along the first direction x is changed to be decreased, so that the LED display panel 200 can be disposed with more second LED devices 22 to increase the total number of LED devices 20.

Figure 3:
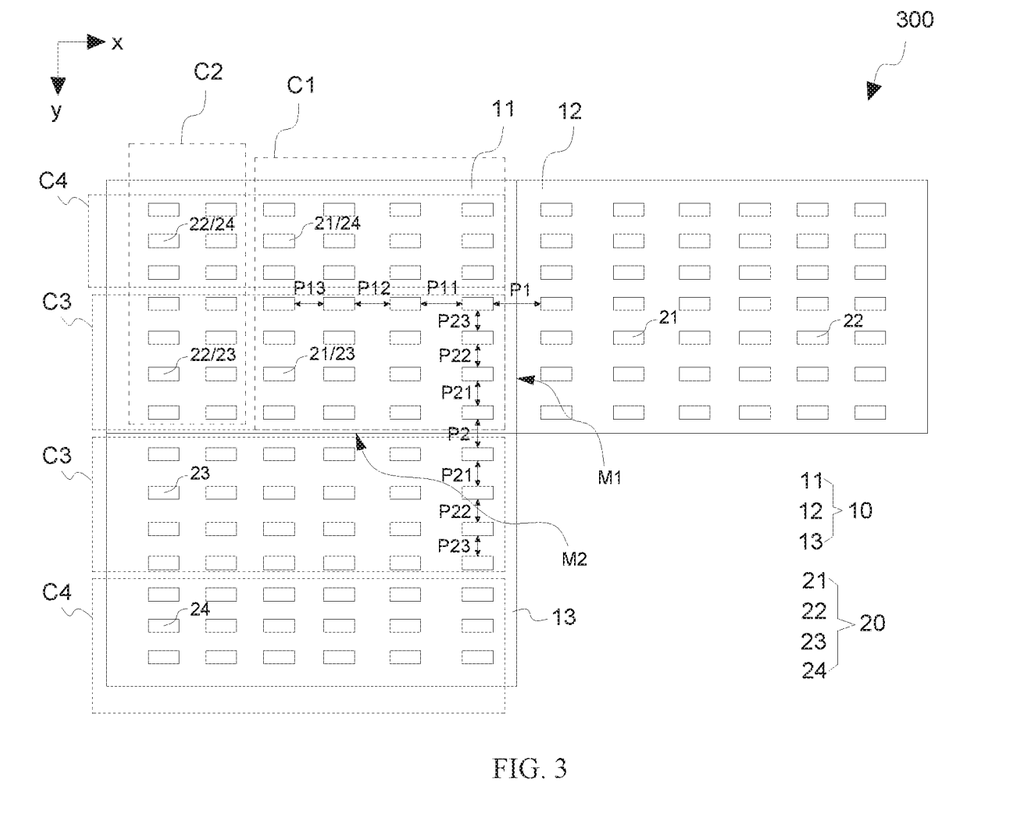
FIG. 3 is a schematic structural diagram of a third embodiment of the LED display panel of the present application.

Referring to FIG. 3, in the LED display panel 300 of the third embodiment, the number of the sub-substrates is at least three. Specifically, the third embodiment uses the splicing of three sub-substrates as an example for description, but it is not limited to thereof.

The LED display panel 300 of the third embodiment adds a third sub-substrate 13 on the basis of the LED display panel 100 of the first embodiment. The third sub-substrate 13 and the first sub-substrate 11 are spliced and disposed along the second direction y.

Two adjacent sub-substrates are spliced to form a second splicing seam M2 in the second direction y. The second direction y intersects with an extension direction of the second splicing seam M2 and is perpendicular to the first direction x.

Specifically, the second direction y is perpendicular to the extension direction of the second splicing seam M2.

The two adjacent LED devices 20 located on both ends of the second splicing seam have a second splicing distance therebetween, and the second splicing distance is defined as D2+ΔA2, wherein D2 is a second target pitch, and ΔA2 is a second splicing tolerance.

A third region C3 is disposed on the sub-substrates located on both sides of the second splicing seam M2. The third region C3 is located on the sub-substrate close to one side of the second splicing seam M2. The plurality of LED devices 20 comprises a plurality of third LED devices 23, and the third LED devices 23 are disposed on the third region C3.

A pitch between at least portions of two adjacent third LED devices 23 gradually decreases from an end close to the second splicing seam M2 to an end away from the second splicing seam M2 in the third region C3 in the second direction y, and is greater than the second target pitch D2.

The LED display panel 300 of the third embodiment is on the basis of the first embodiment, and an LED device pitch transition region (i.e. the third region C3) is disposed on both sides of the second splicing seam M2. A pitch between the third LED devices 23 gradually changes from an end close to the second splicing seam M2 to an end away from the second splicing seam M2 in the third region C2 to improve visual effects of overly large second splicing seam M2, thereby improving display effects of the LED display panel 300.

In each column of third LED devices 23 in the third region C3 of the first substrate 11, a pitch between two adjacent third LED devices 23 gradually decreases in the third region C3 in the second direction y from an end close to the second splicing seam M2 to an end away from the second splicing seam M2.

In the third region C3 in the second direction y, the number of the third LED devices 23 is between 2 and 150. In other words, the transition from P2 to D2 requires 2 to 150 third LED devices 23. Optionally, the number of the third LED devices 23 is between 4 and 100.

Specifically, the transition of four columns of third LED devices 23 from a side close to the second splicing seam M2 to a side away from the second splicing seam M2 in the third embodiment is taken as an example, and there are the first, second, third, and fourth columns of the third LED device 23 in turn. A pitch between the third LED devices 23 in the first and second columns is P21, a pitch between the third LED devices 23 in the second and third columns is P22, and a pitch between the third LED devices 23 in the third and fourth columns is P23.

Among them, $P2>D2$, $P2>P21>P22>P23>D2$. That is to say, from P2 to P23 can be gradually decreased, or an interval can be decreased. When P2 to P23 is gradually decreased, $P2>P21>P22>P23$, and when an interval from P2 to P23 is decreased, $P2=P21>P22>P23$, $P2>P21=P22>P23$, $P2>P21>P22=P23$, or $P2>P21=P22=P23$, or may be other decreasing conditions.

In the third embodiment, in the third region C3 in the second direction y, the pitch between two adjacent third LED devices 23 decreases from an end close to the second splicing seam M2 to an end away from the second splicing film M2. That is the case of $P2>P21>P22>P23$.

Of course, in some embodiments, the pitch between the third LED devices 23 in the second direction y may also be first decreased, then increased and then decreased, as long as it gradually decreases to close to D2.

In addition, the second splicing distance is defined as $D2+\Delta A2$, wherein D2 is a second target pitch, and $\Delta A2$ is a second splicing tolerance. The second target distance D2 is set according to the resolution of the LED display panel 300. That is, the higher the resolution of the LED display panel 300, the smaller the second target distance D2 between the LED devices 20.

Optionally, D2 is less than or equal to 3 microns. Preferably, D2 is greater than or equal to 0.5 microns but less than or equal to 2 microns. However, the second target distance D2 is not limited to this, and D2 may also be greater than 3 microns, such as 4 microns, 5 microns, and so on.

The second splicing tolerance $\Delta A2$ comprises splicing mechanism tolerances, sub-substrate size tolerances and other size tolerances. The first splicing tolerance $\Delta A2$ causes the second splicing seam M2 to be too large, that is, P2 is greater than D2, thereby affecting the display effects.

In the LED display panel 300 of the third embodiment, the difference between two adjacent pitches from one end close to the second splicing seam M2 to one end away from the second splicing seam M2 is equal in the third region C3 in the second direction y. That is, $P2-P21=P21-P22=P22-P23$.

In some embodiments, the difference between the pitches can also be increased or decreased from an end close to the second splicing seam M2 to an end away from the second splicing seam M2 in the third region C3 in the second direction y. When the difference value increases, it is convenient to quickly fade to D2, which shortens the transition number of the third LED device 23. When the difference value decreases, the gradation tends to be gentle and the visual effects are improved.

In the LED display panel 300 of the third embodiment, a fourth region C4 is further disposed on the sub-substrates, and the fourth region C4 is located on a side of the sub-substrate away from the second splicing seam M2. The plurality of LED devices 20 further comprise a plurality of fourth LED devices 24, and the plurality of fourth LED devices 24 are disposed on the fourth region C4.

A pitch between two adjacent fourth LED devices 24 are equal in the fourth region C4 in the second direction y, and the pitch between any two adjacent fourth LED devices 24 equals to the second target pitch D2.

It should be noted that, in the third embodiment, the first area C1 and the third area C3 partially overlap in the first sub-substrate 11 and the overlap area is close to the first splicing seam M1 and the second splicing seam M2 at the same time. The LED devices 20 in the overlapping area show a gradual change in the first direction x and the second direction y.

The LED devices 20 located in the overlapping area are both the first LED devices 21 and the third LED devices 23.

Optionally, the LED devices 20 on the first sub-substrate 11 and the LED devices on the second sub-substrate 12 are arranged symmetrically related to the first splicing seam M1. The LED devices 20 on the first sub-substrate 11 and the LED devices of the third sub-substrate 13 are arranged axisymmetrically related the second splicing seam M2.

In an LED display panel of the present application, an LED device pitch transition region (i.e. a first region) is disposed on both sides of a splicing seam. A pitch between LED devices gradually decreases from an end close to the splicing seam to an end away from the first splicing seam in the first region to improve visual effects of overly large splicing seams, thereby improving display effects of the LED display panel.

The LED display panel by the embodiments of the present application are introduced in detail. The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. A light emitting diode (LED) display panel, comprising a substrate and a plurality of LED devices disposed on the substrate, the plurality of LED devices are arranged in an array, and the substrate is formed by splicing at least two sub-substrates, wherein:
   two adjacent ones of the sub-substrates are spliced to form a first splicing seam in a first direction, the first direction intersects an extension direction of the first splicing seam, two adjacent ones of the LED devices located on both ends of the first splicing seam have a first splicing distance therebetween, and the first splicing distance is defined as D1+ΔA1, wherein D1 is a first target pitch, ΔA1 is a first splicing tolerance, and the first splicing tolerance ΔA1 comprises a splicing mechanism tolerance and a sub-substrate size tolerance;
   the plurality of LED devices comprise a plurality of first LED devices, a first region is disposed on the sub-substrates located on both sides of the first splicing seam, the first region is located on the sub-substrates close a side of the first splicing seam, and the first region is disposed with the plurality of first LED devices thereon;
   a pitch between at least portions of two adjacent ones of the first LED devices gradually decreases from an end close to the first splicing seam to an end away from the first splicing seam in the first region in the first direction, and a pitch between any two adjacent ones of the first LED devices is less than the first splicing distance and greater than the first target pitch;
   a pitch between two adjacent ones of the first LED devices gradually decreases from the end close to the first splicing seam to the end away from the first splicing seam in the first region in the first direction, and the D1 is less than or equal to three microns; and
   a difference between every two adjacent pitches is same, gradually increases, or gradually decreases in the first region in the first direction from the end close to the first splicing seam to the end away from the first splicing seam.

2. The LED display panel according to claim 1, wherein a second region is further disposed on the sub-substrates, and the second region is located on one side of the sub-substrates away from the first splicing seam, the plurality of LED devices further comprise a plurality of second LED devices, and the plurality of the second LED devices are disposed on the second region; and
   a pitch between two adjacent ones of the second LED devices are equal from an end close to the first splicing seam to an end away from the first splicing seam in the second region in the first direction, and a pitch between any two adjacent ones of the second LED devices equals to the first target pitch.

3. The LED display panel of claim 1, wherein a second region is further disposed on the sub-substrates, and the second region is located on one side of the sub-substrates away from the first splicing seam, the plurality of LED devices further comprise a plurality of second LED devices, and the plurality of second LED devices are disposed on the second region; and
   a pitch between two adjacent ones of the second LED devices gradually decreases from an end close to the first splicing seam to an end away from the first splicing seam in the second region in the first direction, and a pitch between any two adjacent ones of the second LED devices is less than or equal to the first target pitch.

4. The LED display panel of claim 1, wherein a number of the sub-substrates is at least three, two adjacent ones of the sub-substrates are spliced to form a second splicing seam in a second direction, and the second direction intersects with an extension direction of the second splicing seam and is perpendicular to the first direction; and
   two adjacent ones of the LED devices located on both ends of the second splicing seam have a second splicing distance therebetween, and the second splicing distance is defined as D2+ΔA2, wherein D2 is a second target pitch, and ΔA2 is a second splicing tolerance;
   a third region is disposed on the sub-substrates located on both sides of the second splicing seam, the third region is located on the sub-substrates close to one side of the second splicing seam, the plurality of LED devices comprise a plurality of third LED devices, and the third LED devices are disposed on the third region; and
   a pitch between at least portions of two adjacent ones of the third LED devices gradually decreases from an end close to the second splicing seam to an end away from the second splicing seam in the third region in the second direction, and is greater than the second target pitch.

5. The LED display panel according to claim 4, wherein a pitch between two adjacent ones of the third LED devices gradually decreases in the third region in the second direction from the end close to the second splicing seam to the end away from the second splicing seam.

6. The LED display panel of claim 4, wherein the D2 is less than or equal to three microns.

7. The LED display panel according to claim 5, wherein differences between every two adjacent pitches are equal, gradually increase, or gradually decrease in the third region in the second direction from the end close to the second splicing seam to the end away from the second splicing seam.

8. An LED display panel, comprising a substrate and a plurality of LED devices disposed on the substrate, the plurality of LED devices are arranged in an array, and the substrate is formed by splicing at least two sub-substrates, wherein:
   two adjacent ones of the sub-substrates are spliced to form a first splicing seam in a first direction, the first direction intersects an extension direction of the first splicing seam, two adjacent ones of the LED devices located on both ends of the first splicing seam have a first splicing distance therebetween, and the first splicing distance is defined as D1+ΔA1, wherein D1 is a first target pitch, and ΔA1 is a first splicing tolerance, and the first splicing tolerance ΔA1 comprises a splicing mechanism tolerance and a sub-substrate size tolerance;
   the plurality of LED devices comprise a plurality of first LED devices, a first region is disposed on the sub-substrates located on both sides of the first splicing seam, the first region is located on the sub-substrates close a side of the first splicing seam, and the first region is disposed with the plurality of first LED devices thereon;
   a pitch between at least portions of two adjacent ones of the first LED devices gradually decreases from an end close to the first splicing seam to an end away from the first splicing seam in the first region in the first direction, and a pitch between any two adjacent ones of the first LED devices is less than the first splicing distance and greater than the first target pitch;

a pitch between two adjacent ones of the first LED devices gradually decreases from the end close to the first splicing seam to the end away from the first splicing seam in the first region in the first direction; and a difference between every two adjacent pitches is same, gradually increases, or gradually decreases in the first region in the first direction from the end close to the first splicing seam to the end away from the first splicing seam.

9. The LED display panel of claim 8, wherein the D1 is less than or equal to three microns.

10. The LED display panel of claim 8, wherein a second region is further disposed on the sub-substrates, and the second region is located on one side of the sub-substrates away from the first splicing seam, the plurality of LED devices further comprise a plurality of second LED devices, and the plurality of the second LED devices are disposed on the second region; and a pitch between two adjacent ones of the second LED devices are equal from an end close to the first splicing seam to an end away from the first splicing seam in the second region in the first direction, and a pitch between any two adjacent ones of the second LED devices equals to the first target pitch.

11. The LED display panel of claim 8, wherein a second region is further disposed on the sub-substrates, and the second region is located on one side of the sub-substrates away from the first splicing seam, the plurality of LED devices further comprise a plurality of second LED devices, and the plurality of the second LED devices are disposed on the second region; and a pitch between two adjacent ones of the second LED devices gradually decreases from an end close to the first splicing seam to an end away from the first splicing seam in the second zone in the first direction, and a pitch between any two adjacent ones of the second LED devices is less than or equal to the first target pitch.

12. The LED display panel according to claim 8, wherein a number of the sub-substrates is at least three, two adjacent ones of the sub-substrates are spliced to form a second splicing seam in a second direction, and the second direction intersects with an extension direction of the second splicing seam and is perpendicular to the first direction; and two adjacent ones of the LED devices located on both ends of the second seam have a second splicing distance therebetween, and the second splicing distance is defined as D2+ΔA2, wherein D2 is a second target pitch, and ΔA2 is a second splicing tolerance;

a third region is disposed on the sub-substrates located on both sides of the second splicing seam, the third region is located on the sub-substrates close to one side of the second splicing seam, the plurality of LED devices comprise a plurality of third LED devices, and the third LED devices are disposed on the third region; and a pitch between at least portions of two adjacent ones of the third LED devices gradually decreases from an end close to the second splicing seam to an end away from the second splicing seam in the third region in the second direction, and is greater than the second target pitch.

13. The LED display panel of claim 12, wherein a pitch between two adjacent ones of the third LED devices gradually decreases in the third region in the second direction from the end close to the second splicing seam to the end away from the second splicing seam.

14. The LED display panel of claim 12, wherein the D2 is less than or equal to three microns.

15. The LED display panel according to claim 13, wherein differences between every two adjacent pitches are equal, gradually increase, or gradually decrease in the third region in the second direction from the end close to the second splicing seam to the end away from the second splicing seam.

16. The LED display panel of claim 13, wherein a fourth region is further disposed on the sub-substrates, and the fourth region is located on a side of the sub-substrates away from the second splicing seam, the plurality of LED devices further comprise a plurality of fourth LED devices, and the plurality of fourth LED devices are disposed on the fourth region; and a pitch between two adjacent ones of the fourth LED devices are equal in the fourth region in the second direction, and a pitch between any two adjacent ones of the fourth LED devices equals to the second target pitch.

17. The LED display panel of claim 13, wherein the first direction is perpendicular to the extension direction of the first splicing seam, and the second direction is perpendicular to the extension direction of the second splicing seam.

* * * * *